United States Patent [19]

Eschenbach et al.

[11] Patent Number: 5,108,334
[45] Date of Patent: Apr. 28, 1992

[54] DUAL DOWN CONVERSION GPS RECEIVER WITH SINGLE LOCAL OSCILLATOR

[75] Inventors: Ralph E. Eschenbach, Redwood City; Arthur N. Woo, Cupertino, both of Calif.

[73] Assignee: Trimble Navigation, Ltd., Sunnyvale, Calif.

[21] Appl. No.: 360,081

[22] Filed: Jun. 1, 1989

[51] Int. Cl.$^5$ .................................... H04B 1/26
[52] U.S. Cl. .............................. 455/314; 455/318; 331/22
[58] Field of Search .................. 455/314–315, 455/318–319; 331/22, 31, 51, 60

[56] References Cited

U.S. PATENT DOCUMENTS

| | | | |
|---|---|---|---|
| 4,580,289 | 4/1986 | Enderby | 455/314 |
| 4,673,891 | 6/1987 | Remy | 331/31 |
| 4,727,594 | 2/1988 | Ruppel | 455/314 |

FOREIGN PATENT DOCUMENTS 0133432  5/1989  Japan .................. 455/314

Primary Examiner—Reinhard J. Eisenzopf
Assistant Examiner—Andrew Faile
Attorney, Agent, or Firm—Thomas E. Schatzel

[57] ABSTRACT

An antenna is employed to receive a (1540 f0) L1 GPS-satellite signal. In addition, a filter, an (RF) amplifier, a harmonic mixer, and a (sole) local oscillator are employed, the combination configured to mix the seventh harmonic of a 192 f0 local oscillator generated signal with the receive satellite signal to down-convert the frequency of the received GPS-satellite signal to a 196 f0 IF frequency. Further, another filter, an (IP) amplifier, and a mixer are employed, the combination configured to mix the fundamental of the 192 f0 local oscillator generated signal with the 196 f0 GPS-satellite signal to down-convert the frequency of the satellite signal to four f0. Finally, yet another filter and an amplifier are employed, the combination configured to filter and amplify the four f0 GPS-satellite signal.

4 Claims, 2 Drawing Sheets

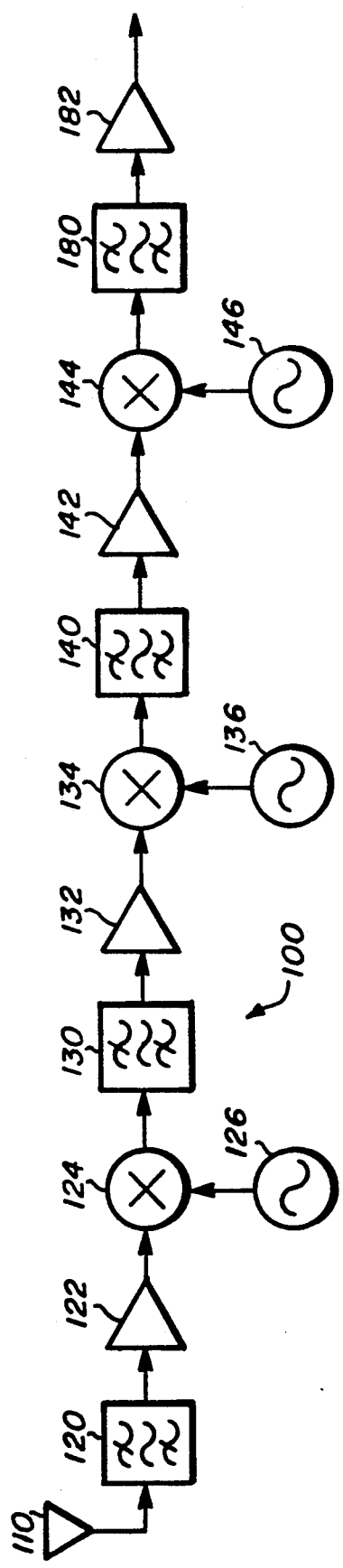
Fig._1 (PRIOR ART)
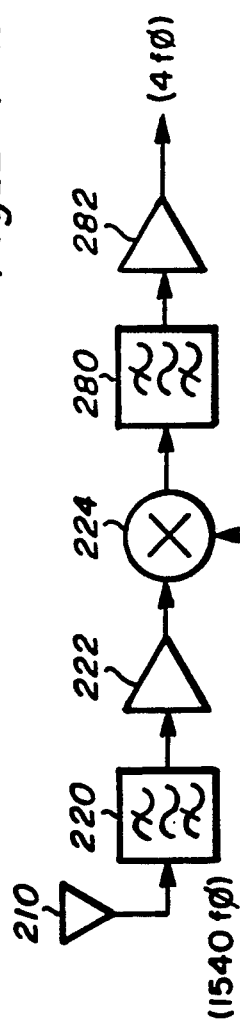
Fig._2 (PRIOR ART)

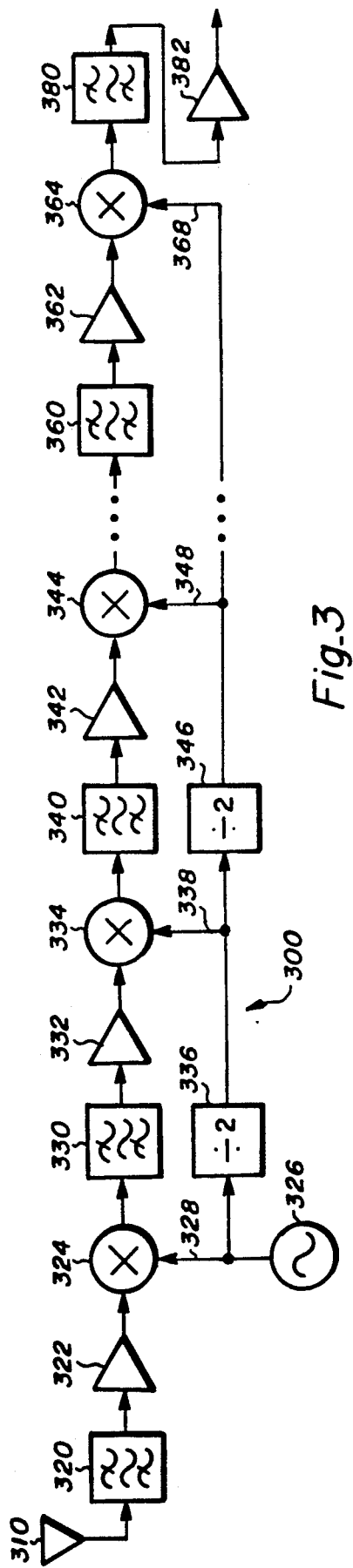
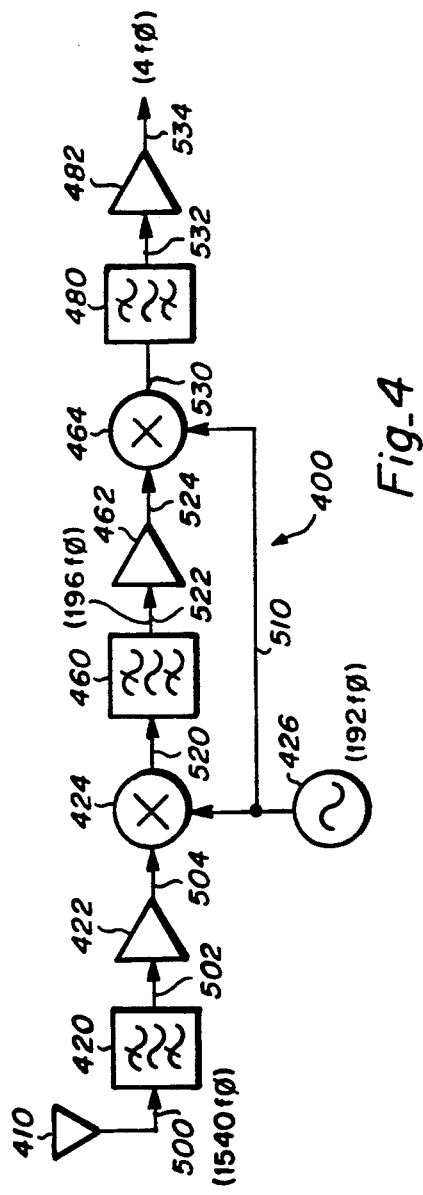
Fig_3
Fig_4

DUAL DOWN CONVERSION GPS RECEIVER WITH SINGLE LOCAL OSCILLATOR

TECHNICAL FIELD

The present invention relates to radio receivers generally and more particularly to a dual down conversion, GPS-satellite signal receiver employing a single local oscillator.

BACKGROUND ART

The NAVASTAR Global Positioning System (GPS) is a United States Defense Department satellite-based radio-navigation system transmitting information from which extremely accurate navigational information can be computed including the time, the user's three-dimensional position anywhere on or near the Earth, and the user's three-dimensional velocity. When fully operational, the GPS is planned to employ 18 satellites evenly dispersed in three, inclined, 12-hour circular orbits chosen to insure continuous 24-hour coverage worldwide. Each satellite carries extremely accurate cesium and rubidium vapor atomic clocks providing timing information. Additionally, each satellite is provided clock correction and orbital information by Earth-based monitoring stations.

Each satellite transmits a pair of L-band carrier signals including an L1 signal having a frequency of 1575.42 MHz (also referred to as 1540 f0 where f0 is 1.023 MHz) and an L2 signal having a frequency of 1227.6 MHz (1200 f0). The L1 and L2 signals are biphase modulated by pseudo-random noise (PRN) codes. The PRN codes facilitate multiple access. Since each satellite uses different PRN codes, a signal transmitted by a particular satellite can be selected by generating and matching (correlating) the corresponding PRN code pattern. Additionally, the PRN codes facilitate signal transmit time measurements which can be made by measuring the phase shift required to match the code. Both of the carrier signals (L1 and L2) are modulated by a PRN code which is referred to as a precision (p) code. The p PRN code, which is intended for military purposes, is a relatively long, fine-grained, precision code having a clock rate of 10.23 MHz (10 f0). The L1 carrier signal is additionally modulated by a PRN code which is referred to as a clear/acquisition (C/A) code. The C/A PRN code, which is intended for rapid signal acquisition and for commercial purposes, is a relatively short, coarsegrained code having a clock rate of 1.023 MHz (f0) and a code length of 1023 bits (one millisecond). A full bit (chip) of C/A PRN code, phase delay corresponds to a distance of 293 meters. In addition to the PRN codes, both of the signals (L1 and L2) are, continuously, biphase modulated by a 50 bit per second, 1500 bit long, navigation data bit stream. The navigation data bit stream includes information as to the status and emphemeris of all satellites, parameters for computing the particular satellite clock, and corrections for atmospheric propagation delays.

Due to limitations of conventional mixers and filters, commonly, prior-art-type, GPS-satellite signal receivers receive and down convert (to base band frequency), in multiple steps, the frequency of an (L1 or L2) GPS-satellite signal. More specifically, absent suitable filtering, conventional mixers, fold over a GPS-satellite signal, image frequency noise, which, if not removed, degridates the receiver performance. (Conventional mixers, when driven by a local oscillator (L0) signal, down-convert to an intermediate frequency (IF) both the signal (and/or noise) at the L0 frequency plus the IF frequency and the signal (and/or noise) at the L0 frequency minus the IF frequency. The L0 frequency plus the IF frequency is commonly referred to as the sum frequency; and, the L0 frequency minus the IF frequency is commonly referred to as the difference frequency. The undesired one of the sum and difference frequencies is commonly referred to as the image frequency. It should be noted that the image frequency differs from the desired, satellite-signal frequency, by twice the IF frequency.)

To remove the image frequency noise, commonly, prior-art-type, GPS-satellite signal receivers use a filter connected (in the satellite signal path) ahead of the mixer. The filter is designed (with a stop band) to attenuate the level of the image frequency noise (of the associated mixer) and (a pass band) to pass, relatively unattenuated, the level of the satellite signal. Unfortunately, the state of the filter art is such that it is relatively difficult to build a filter having a stop band relatively close to a pass band, such as is required if a conventional mixer is configured to down-convert directly to base band (or near base band) frequency the frequency of a GPS-satellite signal. As a compromise, common practice is to down convert the frequency of GPS-satellite signal in multiple steps in which the frequency of the GPS-satellite signal is reduced in each step by a factor of from five to ten.

Illustrated in FIG. 1 of the drawing generally designated by the number 100 is the radio frequency (RF) portion of a typical, "three-stage," prior-art-type, GPS-satellite signal receiver. Receiver 100 is shown to employ an antenna, designated 110, for receiving a GPS-satellite signal. In addition, receiver 100 is shown to employ a filter 120, an (RF) amplifier 122, a mixer 124, and a local oscillator 126, the combination configured to down-convert to a first IF frequency, the frequency of the received GPS-satellite signal. Also, receiver 100 is shown to employ another filter 130, an (IF) amplifier 132, another mixer 134, and another local oscillator 136, the combination configured to down-convert from the first IF frequency to a second IF frequency, the frequency of the received GPS-satellite signal. Further, receiver 100 is shown to employ still another filter 140, another (IF) amplifier 142, still another mixer 144, and still another local oscillator 146, the combination configured to down-convert from the second IF frequency to base band (or near base band) frequency, the frequency of the received GPS-satellite signal. Finally, receiver 100 is shown to employ yet another filter 180 and an amplifier 182, the combination configured to filter and amplify the down-converted, GPS-satellite signal.

Typically, the first IF frequency is from one tenth to one fifth the frequency of the received GPS-satellite signal frequency; and, the second IF frequency is from one tenth to one fifth the first IF frequency. Filter 120 is designed (with a stop band) to attenuate the level of the image frequency noise of mixer 124 and (a pass band) to pass, relatively unattenuated, the level of the received, GPS-satellite signal. Similarly, filter 130 is designed (with a stop band) to attenuate the level of the image frequency noise of mixer 134 and (a pass band) to pass, relatively unattenuated, the level of the first IF frequency, received, GPS-satellite signal. Finally, filter 140 is designed (with a stop band) to attenuate the level of the image frequency noise of mixer 144 and (a pass band) to pass, relatively unattenuated, the level of the second IF frequency, received, GPS-satellite signal.

It should be noted that not only is receiver 100 relatively complex, but, the receiver requires the use of three local oscillators (126, 136, and 146). Unfortunately, each of the three local oscillators (126, 136, and 146) is relatively expensive, particularly oscillator 126, due to its relatively high operating frequency. Further, each of the three local oscillators (126, 136, and 146) dissipates a relative large amount of power.

A much less complex, "single-stage," Global Positioning System Course Acquisition Code Receiver is disclosed in the U.S. Pat. No. 4,754,465 of Charles R. Trimble, the RF portion of which is illustrated in FIG. 2 of the drawing generally designated by the number 200. Receiver 200 is shown to employ an antenna, designated 210, for receiving the L1 (1540 f0) GPS-satellite signal. In addition, receiver 200 is shown to employ a filter 220, an (RF) amplifier 222, a mixer 224, and a local oscillator 226, the combination configured to down-convert, directly, to four f0, the frequency of the received GPS-satellite signal. Finally, receiver 200 is shown to employ another filter 280 and an amplifier 282, the combination configured to filter and amplify the down-converted (four f0), GPS-satellite signal. Although a separate RF filter (220) is shown, the filtering function is performed by amplifier 222.

Mixer 224 is of the starved-L0, balanced-type (image-reject harmonic mixer) to cancel (reject) signals and noise at the mixer image frequency (1532 f0). Local oscillator 226 generates a 768 f0 signal the level of which is sufficient to cause mixer 224 to double the frequency of the signal to 1536 f0 for mixing with an L1 (1540 f0) satellite signal to down convert the frequency of the satellite signal directly to four f0. It is important to note that, although an RF filter (220) is shown, the purpose of the filter is not to attenuate the level of the image frequency noise. The image frequency noise is canceled (rejected) by mixer 224. Further, it is important to note that receiver 200 employs only one local oscillator (for reduced power consumption), and that that oscillator is relatively inexpensive, as it operates at a relatively low frequency. Unfortunately, the mixer (224) is relatively expensive.

DISCLOSURE OF THE INVENTION

It is therefore the primary object of the present invention to provide a GPS-satellite signal receiver which is relatively inexpensive.

Another object of the present invention is to provide a GPS-satellite signal receiver which uses relatively little power.

Yet another object of the present invention is to provide a GPS-satellite signal receiver which is not relatively complex.

Briefly, the RF portion of the presently preferred embodiment of a GPS-satellite signal receiver in accordance with the present invention employs an antenna for receiving a (1540 f0) L1 GPS-satellite signal. In addition, the receiver employs a filter, an (RF) amplifier, a harmonic mixer, and a (sole) local oscillator, the combination configured to mix the seventh harmonic of a 192 f0 local oscillator generated signal with the receive GPS-satellite signal to down-convert the frequency of the satellite signal to a 196 f0 IF frequency. Further, the receiver employs still another filter, an (IF) amplifier, and a mixer, the combination configured to mix the fundamental of the 192 f0 local oscillator generated signal with the 196 f0 GPS-satellite signal to down-convert the frequency of the satellite signal to four f0. Finally, the receiver employs yet another filter and an amplifier, the combination configured to filter and amplify the four f0 GPS-satellite signal.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of the RF portion of a typical, prior-art-type, GPS-satellite signal receiver.

FIG. 2 is a schematic diagram of the RF portion of the Global Positioning System Course Acquisition Code Receiver disclosed in the U.S. Pat. No. 4,754,465 of Charles R. Trimble.

FIG. 3 is a schematic diagram of the RF portion of a GPS-satellite signal receiver in accordance with the present invention.

FIG. 4 is a schematic diagram of the RF portion of the presently preferred embodiment of a GPS-satellite signal receiver in accordance with the present invention.

BEST MODE FOR CARRYING OUT THE INVENTION

Illustrated in FIG. 3 of the drawing generally designated by the number 300 is the RF portion of a GPS-satellite signal receiver in accordance with the present invention. Receiver 300, which is referred to herein as an "m-stage" receiver, is shown to employ an antenna, designated 310, for receiving a GPS-satellite signal. In addition, receiver 300 is shown to employ a filter 320, an (RF) amplifier 322, a mixer 324, and a local oscillator 326. Local oscillator 326 is configured to develop on a line 328 a local oscillator signal suitable for driving mixer 324. The combination of filter 320, amplifier 322, mixer 324, and local oscillator 326 are configured to down-convert to a first IF frequency, the frequency of the received GPS-satellite signal. Also, receiver 300 is shown to employ another filter 330, an (IF) amplifier 332, another mixer 334, and a divide by two frequency divider 336. Divider 336 is configured to divide by two the frequency of the local oscillator signal developed on line 328 by local oscillator 326 to develop on a line 338 a "local oscillator" signal suitable for driving mixer 334. The combination of filter 330, amplifier 332, mixer 334, and divider 336 are configured to convert from the first IF frequency to a second IF frequency, the frequency of the received GPS-satellite signal. Further, receiver 300 is shown to employ still another filter 340, another (IF) amplifier 342, still another mixer 344, and another divide by two frequency divider 346. Divider 346 is configured to divide by two the frequency of the "local oscillator" signal developed on line 338 by divider 336 to develop on a line 348 a "local oscillator" signal suitable for driving mixer 344. The combination of filter 340, amplifier 342, mixer 344, and divider 346 are configured to convert from the second IF frequency to a third IF frequency, the frequency of the received GPS-satellite signal. Also, receiver 300 has a number (m-3) of additional "stages," which are represented by an mth "stage." The mth "stage" is shown to employ still another filter 360, another (IF) amplifier 362, and still another mixer 364. It is important to not that the last (mth) "stage" does not employ a divide by two frequency divider. Rather, the last (mth) "stage" mixer (364) is directly connected (by a line 368) to the previous ((m-1)st-) "stage" mixer to receive a common "local oscillator" signal. The combination of filter 360, amplifier 362, and mixer 364 are configured to down-convert the frequency of the received GPS-satellite signal from the previous "stage"((m-2)nd) IF frequency to base band (or near base band) frequency, a frequency referred to herein as n (MHz). Finally, receiver 300 is shown to employ yet another filter 380 and an amplifier 382, the combination configured to filter and amplify the downconverted, GPS-satellite signal. In this embodiment, the frequency of the (sole) local oscillator (326) is equal to one half the difference (in MHz) between the received GPS-satellite signal frequency and n.

In one embodiment, receiver 300 has four "stages" (m =4) and converts a (1540 f0) L1 GPS-satellite signal down to four f0 (n =4 f0). As a consequence, the (sole) local oscillator (126) develops on line 328 a local oscillator signal having a frequency of 768 f0 (((1540 f0) - (4 f0))/2). The other frequencies involved are:

| stage number | mixer "local oscillator" input signal frequency | mixer in frequency | mixer out frequency |
| --- | --- | --- | --- |
| 1 | 768 f0 (line 328) | 1540 f0 | 772 f0 (1540-768) |
| 2 | 384 f0 (768/2)(line 338) | 772 f0 | 388 f0 (772-384) |
| 3 | 192 f0 (384/2)(line 348) | 388 f0 | 196 f0 (388-192) |
| 4 | 192 f0 (lines 348 & 368) | 196 f0 | 4 f0 (196-192) |

Of course, filter 120 should be designed (with a stop band) to attenuate the level of the image frequency noise of mixer 124 and (a pass band) to pass, relatively unattenuated, the level of the received, GPS-satellite signal. Similarly, filter 130 should be designed (with a stop band) to attenuate the level of the image frequency noise of mixer 134 and (a pass band) to pass, relatively unattenuated, the level of the first IF frequency, received, GPS-satellite signal. Further, filter 140 should be designed (with a stop band) to attenuate the level of the image frequency noise of mixer 144 and (a pass band) to pass, relatively unattenuated, the level of the second IF frequency, received, GPS-satellite signal. Finally, filter 160 is designed (with a stop band) to attenuate the level of the image frequency noise of mixer 164 and (a pass band) to pass, relatively unattenuated, the level of the third IF frequency, received, GPS-satellite signal. However, it is important to note that, the image frequency of each of the mixers (124, 134, and 144) except the last (mth) "stage" mixer (164) is equal to four f0 (n). As a consequence, the filtering required of each of the filters (120, 130, and 140) except the last (mth) "stage" filter (160) is trivial. Thus, although separate filters (120, 130, and 140) are shown in FIG. 3, preferably, the required filtering is performed by the associated amplifier (amplifier 122 for filter 120, amplifier 132 for filter 130, and amplifier 142 for filter 140). It is also important to note that, as a consequence, except for the antenna (110), the (sole) local oscillator (126), and the last (mth) "stage" filter (160), the various components of the RF portion of the GPS-satellite signal receiver (300) illustrated in FIG. 3 are all amenable to being integrated into a single integrated circuit-type device.

Illustrated in FIG. 4 of the drawing generally designated by the number 400 is the presently preferred embodiment of the RF portion of a GPS-satellite signal receiver in accordance with the present invention. Receiver 400 is shown to employ an antenna, designated 410, for receiving a GPS-satellite signal. In addition, receiver 400 is shown to employ, in what is referred to herein as an "mth""stage," a filter 420, an (RF) amplifier 422, a mixer 424, and a local oscillator 426. Also, receiver 400 is shown to employ another filter 460, an (IF) amplifier 462, and another mixer 464. Finally, receiver 400 is shown to employ yet another filter 480 and an amplifier 482. To down-convert to an ("(m-1)st") IF frequency, the frequency of the received GPS-satellite signal, antenna 410 is shown coupled by the series combination of a line 500, filter 420, a line 502, amplifier 422, and a line 504 to the GPS-satellite signal (RF) input of mixer 424. The local oscillator input of mixer 424 is coupled by a line 510 to the output of local oscillator 426. To down-convert the frequency of the received GPS-satellite signal from the ("(m-1)st") IF frequency to base band (or near base band) frequency, a frequency referred to herein as n (MHz), the GPS-satellite signal (IF) output of mixer 424 is shown coupled by the series combination of a line 520, filter 460, a line 522, amplifier 462, and a line 524 to the GPS-satellite signal (RF) input of mixer 464. The local oscillator input of mixer 464 is, directly, connected to line 510. Finally, to filter and amplify the down-converted, GPS-satellite signal, the GPS-satellite signal (IF) output of mixer 464 is coupled by a line 530, filter 480, and a line 532 to the input of amplifier 482, the output of which is connected to a line 534.

In one embodiment, receiver 400 uses frequencies calculated as above mentioned for m equals 2. Specifically, to convert a (1540 f0) L1 GPS-satellite signal down to four f0 (n equals four f0), the (sole) local oscillator (426) develops on line 510 a local oscillator signal having a frequency of 768 f0 (((1540 f0) −(4 f0))/2). The IF frequency is 772 f0.

In the presently preferred embodiment, mixer 424 of receiver 400 is of the harmonic type. Further, in the presently preferred embodiment, a harmonic of the local oscillator generated signal is used to drive mixer 424. The harmonic used is one less than the number two raised to the m minus first power, as if the receiver (400) had m "stages." Specifically, in the presently preferred embodiment, the received GPS-satellite signal frequency is 1540 f0; n equals four; and, m equals four (as if there were four stages). Fifteen forty f minus four f0 is 1536. From the embodiment shown in FIG. 3, with m equal to four, the "(m-1)st" IF frequency is 196 f0; and, the "mth""stage""local oscillator" frequency is 192 f0. M minus one is three; two to the third power is eight; and, eight minus one is seven. Thus, the seventh harmonic of a signal generated by a local oscillator (426) operating at 192 f0 is mixed (in mixer 424) with a 1540 of GPS-satellite signal to down-convert the frequency of the GPS-satellite signal to 196 f0. The (fundamental) of the local oscillator (426) generated signal is mixed (in mixer 464) with the 196 f0 frequency GPS-satellite signal to down-convert the frequency of the GPS-satellite signal to four f0.

It is contemplated that after having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A receiver for receiving a 1540 f0 frequency GPS satellite signal, said receiver comprising in combination:

an antenna for receiving the signal;

m stages where m is an integer of at least three, including, a first stage having, means for filtering and amplifying the received signal, a local oscillator for generating a first local oscillator signal, and a first mixer connected to said received signal filtering and amplifying means and to said local oscillator, said first mixer for mixing said first local oscillator signal with said filtered and amplified receive signal to down-convert frequency of said filtered and amplified received signal to a first IF frequency, a second stage having, means for filtering and amplifying said first IF frequency received signal, a first frequency divider connected to said local oscillator, said first frequency divider for dividing by two the frequency of said first local oscillator signal to develop a second local oscillator signal, and a second mixer connected to said first IF frequency received signal filtering and amplifying means and to said first frequency divider, said second mixer for mixing said second local oscillator signal with said filtered and amplified first IF frequency received signal to down-convert the frequency of said filtered and amplified first IF frequency received signal to a second IF frequency, an (m-1)st stage having, means for filtering and amplifying a (m-2)nd IF frequency received signal, a (m-1)st frequency divider for dividing by two the frequency of a (m-2)nd local oscillator signal to develop an (m-1)st local oscillator signal, and an (m-1)st mixer connected to said (m-1)st IF frequency received signal filtering and amplifying means and to said (m-1)st frequency divider, said (m-1)st mixer for mixing said (m-1)st local oscillator signal with a filtered and amplified (m-2)nd IF frequency received signal to down-convert the frequency of said filtered and amplified (m-2)nd IF frequency received signal to a (m-1)st IF frequency, an mth stage having, means for filtering and amplifying said (m-1)st IF frequency received signal, and a mth mixer connected to said (m-1)st IF frequency received signal filtering and amplifying means and to said (m-1)st frequency divider, said mth mixer for mixing said (m-1)st local oscillator signal with said filtered and amplified (m-1)st IF frequency received signal to down-convert the frequency of said filtered and amplified (m-1) IF frequency received signal to an output frequency; and means for filtering and amplifying said output frequency received signal and wherein said first local oscillator signal has frequency equal to one half the difference in frequency between said 1540 f0 frequency and said output frequency.

2. A receiver for receiving a 1540 f0 GPS-satellite signal, said receiver comprising in combination:

an antenna for receiving the GPS-satellite signal;

means for filtering and amplifying the received GPS-satellite signal;

a local oscillator for generating a local oscillator signal;

a first mixer connected to said received GPS-satellite signal filtering and amplifying means and to said local oscillator, said first mixer for mixing a predetermined harmonic of said local oscillator signal with said filtered and amplified received GPS-satellite signal to down-convert the frequency of said filtered and amplified received GPS-satellite signal to an IF frequency;

means for filtering and amplifying said IF frequency GPS-satellite signal;

a second mixer connected to said IF frequency GPS-satellite signal filtering and amplifying means and to said local oscillator, said second mixer for mixing the fundamental of said local oscillator signal with said filtered and amplified IF frequency GPS-satellite signal to down-convert the frequency of said filtered and amplified IF frequency GPS-satellite signal to an output frequency; and means for filtering and amplifying said output frequency GPS-satellite signal.

3. A receiver as recited in claim 2 wherein said predetermined harmonic is equal to one less than the number two raised to the m minus first power and wherein m is an integer between three and five inclusive.

4. A receiver as recited in claim 3 wherein m is equal to four.

* * * * *